(12) United States Patent
Jang et al.

(10) Patent No.: US 7,427,145 B2
(45) Date of Patent: Sep. 23, 2008

(54) BACKLIGHT UNIT HAVING LIGHT EMITTING DIODES AND METHOD FOR MANUFACTURING THE SAME

(75) Inventors: Jun Ho Jang, Anyang-Si (KR); Young Joo Yee, Seongnam-Si (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 0 days.

(21) Appl. No.: 11/442,396

(22) Filed: May 30, 2006

(65) Prior Publication Data

US 2006/0268567 A1 Nov. 30, 2006

(30) Foreign Application Priority Data

May 30, 2005 (KR) .................. 10-2005-0045640

(51) Int. Cl.
*F21V 1/00* (2006.01)
(52) U.S. Cl. .............. 362/236; 362/800; 362/235; 257/100; 257/99
(58) Field of Classification Search .......... 362/800, 362/612, 555, 561, 235–236; 257/98–100, 257/594; 349/95
See application file for complete search history.

(56) References Cited

U.S. PATENT DOCUMENTS 6,871,982 B2 * 3/2005 Holman et al. ............... 362/331
2005/0002204 A1 * 1/2005 Lin et al. .................... 362/551
2005/0243576 A1 11/2005 Park et al.
2006/0180828 A1 * 8/2006 Kim et al. ................... 257/100
2007/0007540 A1 * 1/2007 Hashimoto et al. ........... 257/94

FOREIGN PATENT DOCUMENTS

| JP | 2002-298629 | 10/2002 |
| JP | 2004-311791 A | 11/2004 |
| JP | 2004-354534 | 12/2004 |
| WO | WO 2004105142 A1 * | 12/2004 |

* cited by examiner

*Primary Examiner*—Jong-Suk (James) Lee
*Assistant Examiner*—Robert May
(74) *Attorney, Agent, or Firm*—Birch, Stewart, Kolasch & Birch, LLP (57) ABSTRACT

A backlight unit including a substrate disposed thereon with conductive lines, a plurality of light emitting diodes each bonded to an upper surface of the substrate and spaced a predetermined distance apart from the substrate, and electrically connected to the conductive lines of the substrate; a transparent resin encompassing the plurality of light emitting diodes and formed on the upper surface of the substrate, and an optical transmission arrangement disposed on an upper surface of the transparent resin. Further, the arrangement includes a first layer for preventing light emitted from the light emitting diodes from being totally reflected by allowing an incident angle of the light to be less than a threshold angle, and a second layer for diffusing and emitting the light.

11 Claims, 8 Drawing Sheets

BACKLIGHT UNIT HAVING LIGHT EMITTING DIODES AND METHOD FOR MANUFACTURING THE SAME

This application claims priority under 35 U.S.C. § 119 to Korean Patent Application No. 10-2005-0045640, filed on May 30, 2005, the entirety of which is hereby incorporated by reference.

BACKGROUND

This description relates to a backlight unit having light emitting diodes and a method for manufacturing the same Typically, a light emitting diode (LED) is used by being optically coupled with a dome type lens according to its intrinsic characteristic.

Although many researches have been conducted on use of the light emitting diode onto a backlight unit of a liquid crystal display (LCD), it has become apparent that the thickness of the backlight unit has to be increased to embody an even optical characteristic of the light emitting diode in the backlight unit.

The thickness of the backlight unit tends to increase because of necessity of existence of a space if white light emitted from the light emitting diode is supposed to be evenly combined, e.g., bringing about creation of a disadvantage in which thickness of a liquid crystal display system is increased.

Figure 1:
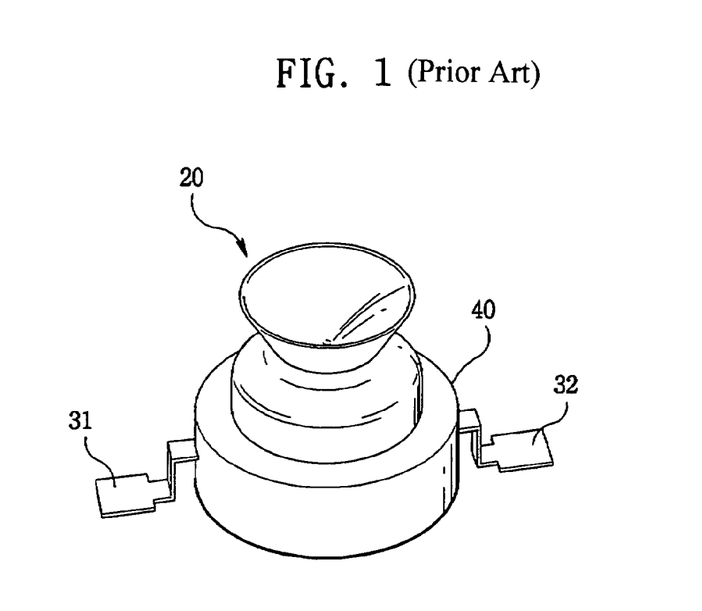
FIG. 1 is a schematic perspective view of a lateral light emitting diode package according to the prior art.

In order to overcome the afore-mentioned disadvantage, attempts have been recently made to package a backlight unit of a liquid crystal display using a light emitting diode package from which light is emitted from a side thereof (hereinafter referred to as a lateral light emitting diode package) as shown in FIG. 1.

FIG. 1 is a schematic perspective view of a lateral light emitting diode package, where the light emitting diode is bonded to a slug, and the slug is laterally positioned with leads 31 and 32 to be electrically bonded to the light emitting diode.

The light emitting diode and the slug are molded by molding means 40 to allow a light emitting surface of the light emitting diode and the leads 31 and 32 to be exposed outside, and a lens 20 encompassing the light emitting diode is bonded to the molding means. If the lateral light emitting diode package is employed as a light source of the liquid crystal display, a small amount of light is emitted from the center of the lateral light emitting diode package to prevent remaining light emitted from the light emitting diode from being incident on a lateral surface of the light emitting diode package, resulting in limit of manufacturing a uniform planar light source.

The emission of light from the center of the lateral light emitting diode package thus described causes an occurrence of a hot spot at the center of a pixel of the liquid crystal display, thereby resulting in degradation of picture quality of the display.

Figure 2:
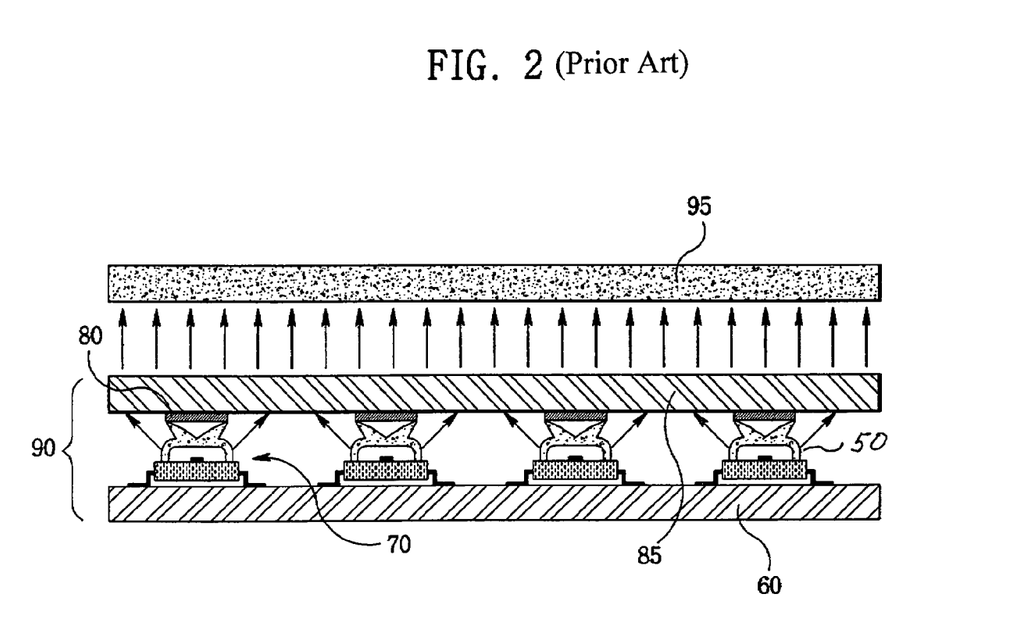
FIG. 2 is a schematic cross-sectional view of a conventional lateral light emitting diode as a backlight unit of a liquid crystal display.

FIG. 2 is a schematic sectional view of a backlight unit of a liquid crystal display employed with a lateral light emitting diode package according to the prior art. In order to overcome the afore-mentioned disadvantage of the hot spot, there is used a hot spot baffle plate at the backlight unit of the liquid crystal display.

In other words, a backlight unit 90 of a liquid crystal display is such that hot spot baffle plates 80 are respectively disposed on each upper side of a plurality of lateral light emitting diode packages 50 packaged in a printed circuit board 60. A light guide plate 85 is disposed on the hot spot baffle plate 80, and a liquid crystal display 95 is disposed above the light guide plate to assemble the backlight unit 90 and liquid crystal display 95.

However, the backlight unit 90 thus constructed has a disadvantage of assembly process being complicated because an assembly job is involved with placing of the hot spot baffle plate 80 named a diverter on the plurality of lateral light emitting diode package 50.

Another disadvantage is that there appears a spot similar to a hot spot on a final screen of a liquid crystal display if there is an erroneous alignment of the hot spot baffle plate 80 on the plurality of lateral light emitting diode package 50.

Still another disadvantage is that the thickness of the liquid crystal display increases as much as that of the hot spot baffle plate 80.

SUMMARY

The present invention is provided to solve the aforementioned disadvantages and it is an object of the present invention to provide a backlight unit having light emitting diodes and a method for manufacturing the same whereby a hot spot is not generated without recourse to use of a conventional lateral light emitting diode package to enable to improve a picture quality, and the method dispenses with an assembling process of placing a hot spot baffle plate to enable to simplify a manufacturing process of a backlight unit, and to reduce a thickness of the backlight unit.

Another object is to bond a guide substrate to a substrate packaged with a light emitting diode, thereby enabling to increase an amount of light emitted toward an upper side of the light emitting diode, and to simplify a manufacturing process of the backlight unit.

In one general aspect, a backlight unit having light emitting diodes comprises: a substrate disposed thereon with conductive lines; a plurality of light emitting diodes each bonded to an upper surface of the substrate and spaced a predetermined distance apart from the substrate, and electrically connected to the conductive lines of the substrate; a transparent resin encompassing the plurality of light emitting diodes and formed on the upper surface of the substrate; and optical transmission means disposed on an upper surface of the transparent resin, the means including first means for preventing light emitted from the light emitting diodes from being totally reflected by allowing an incident angle of the light to be less than a threshold angle, and second means for diffusing and emitting the light.

In another general aspect, a backlight unit having light emitting diodes comprises: a substrate; a plurality of light emitting diodes each packaged to an upper surface of and spaced a predetermined distance apart from the substrate; a guide substrate formed therein with a plurality of through holes each correspondingly positioned to the plurality of light emitting diodes, and bonded to an upper surface of the substrate; and optical transmission means disposed on an upper surface of the guide substrate, the means including first means for preventing light emitted from the light emitting diodes from being totally reflected by allowing an incident angle of the light to be less than a threshold angle, and second means for diffusing and emitting the light.

In still another general aspect, a method for manufacturing a backlight unit having light emitting diodes comprises: bonding a plurality of light emitting diodes to an upper surface of a substrate where conductive lines are disposed, each diode spaced a predetermined distance apart, and electrically connecting the plurality of light emitting diodes to the conductive lines of the substrate; encompassing the plurality of light emitting diodes and forming a transparent resin layer on the upper surface of the substrate; and positioning optical transmission means on an upper surface of the transparent resin layer, the means including first means for preventing light emitted from the light emitting diodes from being totally reflected by allowing an incident angle of the light to be less than a threshold angle, and second means for diffusing and emitting the light.

In still another general aspect, a method for manufacturing a backlight unit having light emitting diodes comprises: bonding a plurality of light emitting diodes to an upper surface of a substrate where conductive lines are disposed, each diode spaced a predetermined distance apart, and electrically connecting the plurality of light emitting diodes to the conductive lines of the substrate; and positioning optical transmission means on an upper surface of a transparent resin layer, the means including first means for preventing light emitted from the light emitting diodes from being totally reflected by allowing an incident angle of the light to be less than a threshold angle, and second means for diffusing and emitting the light.

DETAILED DESCRIPTION

Figure 3:
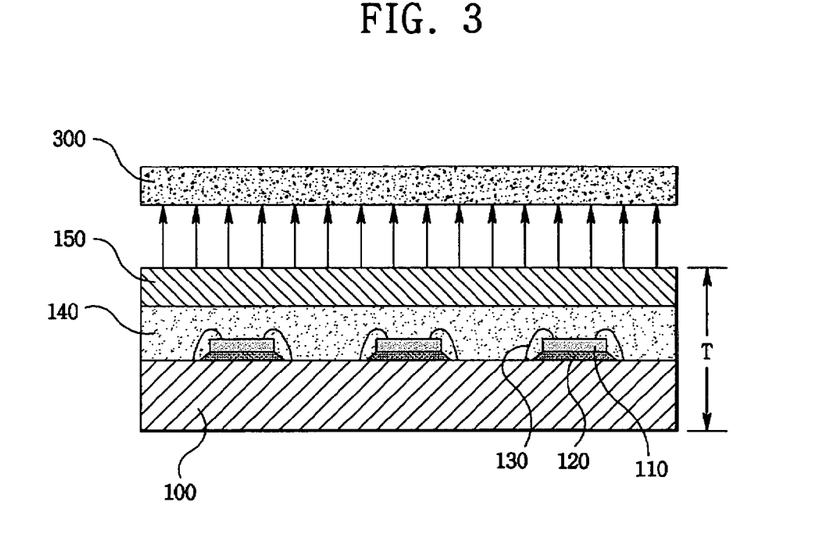
FIG. 3 is a schematic cross-sectional view of a backlight unit having a light emitting diode according to the present invention.

Referring to FIG. 3, a backlight unit having light emitting diodes comprises: a substrate 100 disposed thereon with conductive lines; a plurality of light emitting diodes 110 each bonded to an upper surface of the substrate 100 and spaced a predetermined distance apart from the substrate 100, and electrically connected to the conductive lines of the substrate 100; a transparent resin 140 encompassing the plurality of light emitting diodes 110 and formed on the upper surface of the substrate 100; and optical transmission means 150 disposed on an upper surface of the transparent resin 140, the means including first means for preventing light emitted from the light emitting diodes 110 from being totally reflected by allowing an incident angle of the light to be less than a threshold angle, and second means for diffusing and emitting the light.

The conductive lines are interconnected lest the plurality of light emitting diodes 110 should be electrically short-circuited, and provides current to each light emitting diode 110.

The backlight unit having the light emitting diodes according to the present invention is such that light emitted from the light emitting diodes is incident on the optical transmission means 150 via the transparent resin 140 and the light is diffused by the optical transmission means 150 and is outputted to a liquid crystal diode (LCD. 300) panel.

Consequently, there is an advantage in the backlight unit according to the present invention thus constructed in that there is generated no hot spot to thereby enable to improve a picture quality without recourse to a lateral light emitting diode, unlike the conventional prior art. There is another advantage in that there is no need of assembly process of stacking a hot spot baffle plate to thereby enable to simplify a manufacturing process of a backlight unit and to reduce a thickness (T) of the backlight unit.

Figure 4:
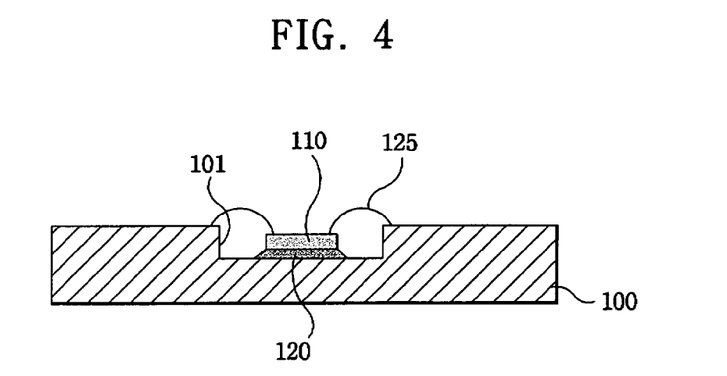
FIG. 4 is a cross-sectional view illustrating a substrate of a backlight unit bonded by a light emitting diode according to a first embodiment of the present invention.

Referring now to FIG. 4, the substrate 100 formed thereon with conductive lines (not shown) and grooves 101 are provided, the light emitting diode 110 is bonded to a floor surface of the groove 101 of the substrate 100 by bonding means 120, and the light emitting diode 110 and the conductive line are bonded by a wire 125. In other words, the light emitting diode 110 is so configured as to be positioned inside the groove 101 of the substrate 100.

Figure 5:
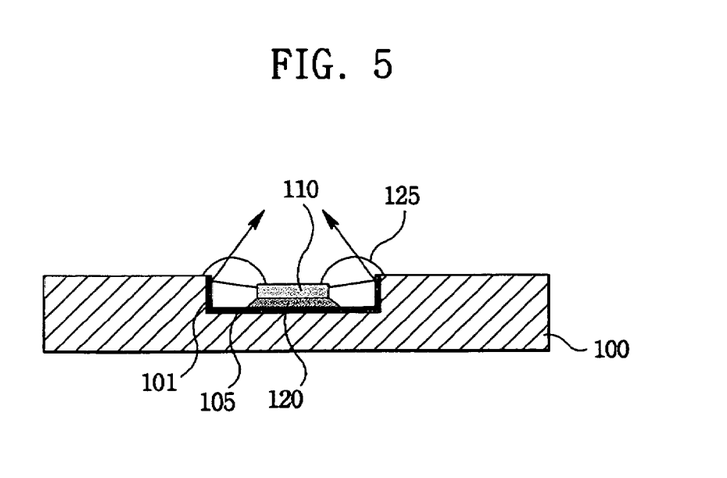
FIG. 5 is a cross-sectional view illustrating a state where a reflection layer is coated on an inner surface of a substrate groove.

Referring to FIG. 5, if a reflection layer 105 is coated on an inner surface of the groove 101 formed in the substrate 100, light emitted from the light emitting diode 110 is reflected from the reflection layer 105 and outputted to the upper surface of the substrate 100. In other words, an amount of light outputted to the upper surface of the substrate 100 from the reflection layer 105 coated on the groove 101 can increase.

Meanwhile, if an inner surface wall of the groove of the substrate is inclined, a larger amount of light can be reflected from the inner surface wall of the substrate and can be outputted to the upper surface of the light emitting diode.

Figure 6:
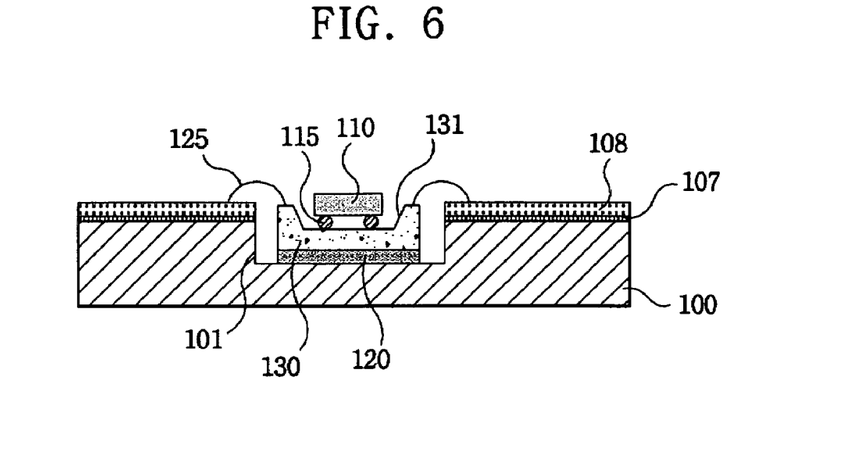
FIG. 6 is a cross-sectional view illustrating a state where a substrate of a backlight unit is bonded to a sub-mount substrate packaged by a light emitting diode according to a second embodiment of the present invention.

Referring to FIG. 6, a substrate is not bonded with a light emitting diode, but bonded with a sub-mount substrate.

In other words, the sub-mount substrate 130 is provided thereon with a groove 131, a floor surface of the groove 131 being formed with a conductive pattern (not shown), and a conductive line electrically connected to the conductive pattern being formed thereon. The light emitting diode 110 is mounted to the conductive pattern existing on the floor surface of the groove 131 of the sub-mount substrate 130 by flip chip bonding. The flip chip bonding uses a conductive bump 115 such as a solder ball or the like as shown in FIG. 6. By this, there is no need to move the light emitting diode 110 in order to bond the light emitting diode 110 to a substrate of the backlight unit, and only thing is to bond the sub-mount substrate 130 to which the light emitting diode 110 is bonded to the groove 101 of the substrate 100 by adhesive means 120.

Preferably, the substrate 100 is a metal substrate, and the metal substrate is formed thereon with an insulation layer 107 on which a conductive line is formed. Wire bonding between a conductive line of the sub-mount substrate 130 and a conductive line 108 of the substrate 100 completes an electrical connection. Therefore, a substrate according to a second embodiment of the present invention can increase thermal emission efficiency by using the metal substrate.

In the description of FIGS. 4 to 6, the groove and the sub-mount substrate corresponds to one light emitting diode, such that because the backlight unit according to the present invention is disposed with a plurality of light emitting diodes, grooves and sub-mount substrates corresponding to respective light emitting diodes exist.

Figure 7:
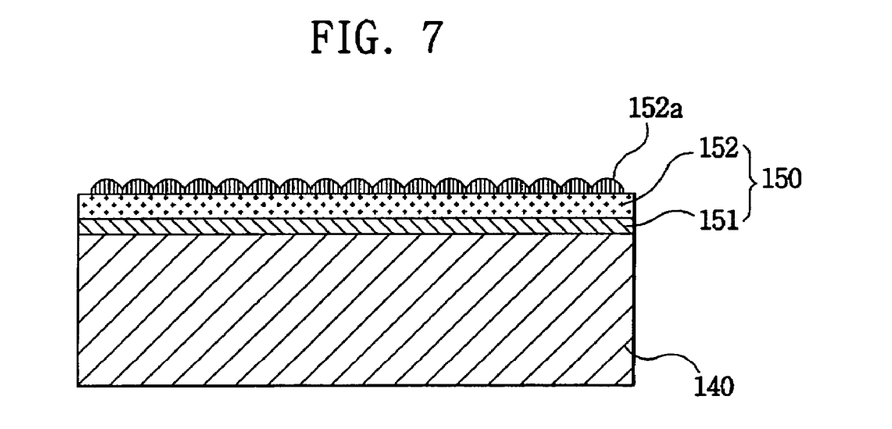
FIG. 7 is a cross-sectional view illustrating optical transmission means of a backlight unit positioned on an upper surface of a transparent resin.

Referring to FIG. 7, optical transmission means 150 includes first means for preventing light emitted from the light emitting diode 110 from being totally reflected by allowing an incident angle of the light to be less than a threshold angle, and second means for diffusing and emitting the light.

The first means may be a micro lens array sheet 152 on which a plurality of lenses 152*a* are arrayed, and the second means may be the conventional light guide plate 151, where each micro lens is curved such that incident light is emitted without total reflection.

As shown in FIG. 7, the transparent resin 140 is disposed thereon with the light guide plate 151, and the light guide plate 151 is arranged thereon with the micro lens array sheet 152, while a sheet surface not formed with lenses of the micro lens array sheet 152 comes into contact with the light guide plate 151.

Figure 8:
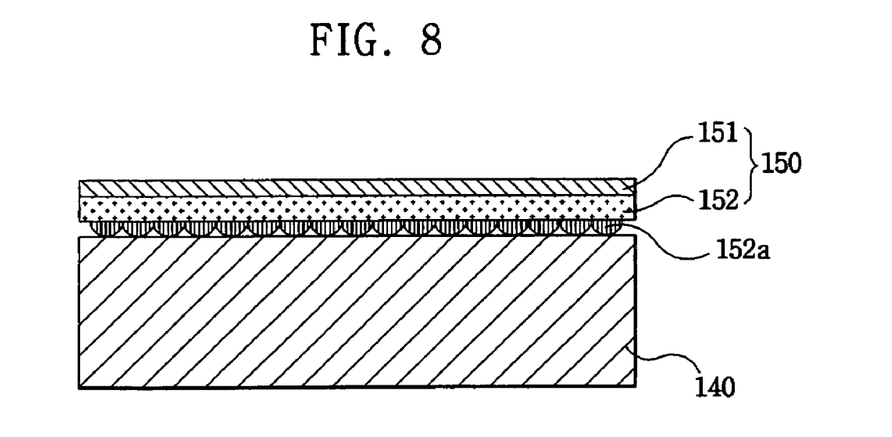
FIG. 8 is another cross-sectional view illustrating optical transmission means of a backlight unit positioned on an upper surface of a transparent resin.

Referring now to FIG. 8, the transparent resin 140 is positioned thereon with a micro lens array 152 and the micro lens array sheet 152 is positioned thereon with the light guide plate 151 while a sheet surface formed with lenses of the micro lens array 152 comes into contact with the transparent resin 140.

Figure 9:
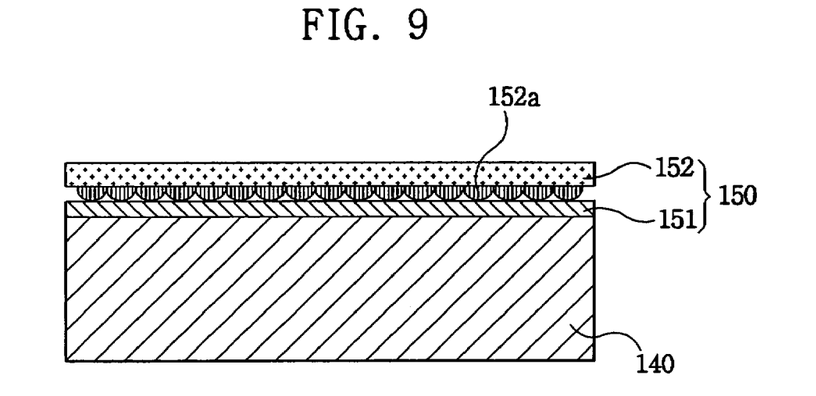
FIG. 9 is still another cross-sectional view illustrating optical transmission means of a backlight unit positioned on an upper surface of a transparent resin.

Referring to FIG. 9, the transparent resin 140 is so made as to be placed thereon with the light guide plate 151, and the light guide plate 151 is positioned thereon with the micro lens array sheet 152, while a sheet surface formed with lenses of the micro lens array 152 is brought into contact with the light guide plate 151.

Figure 10:
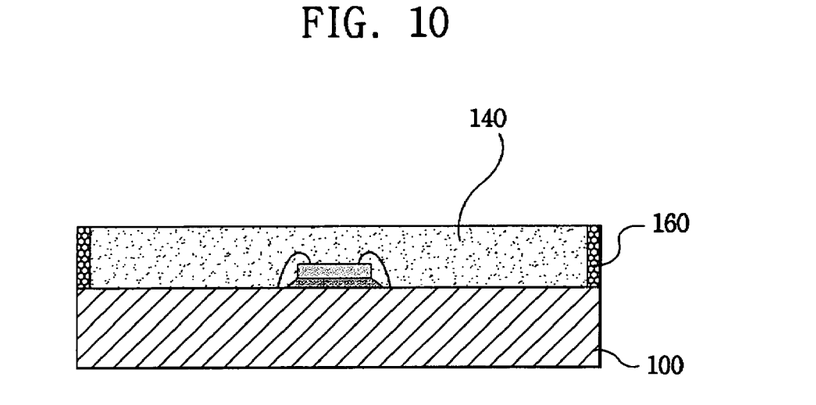
FIG. 10 is a cross-sectional view illustrating an example where a transparent resin is formed on an upper surface of a substrate.

Now, referring to FIG. 10, a transparent resin 140 formed on the upper surface of the substrate 100 is liquid, and the substrate 100 is formed at a margin thereof with a ring-shaped guide part 160, and the guide part 160 is coated therein with the liquid transparent resin 140, and the substrate is filled thereon with the transparent resin 140. The guide part 160 serves to prevent the liquid transparent resin 140 from flowing outside.

Thereafter, when the liquid transparent resin 140 is coated on the substrate 100 inside the guide part 160, and heat is applied and hardened, the transparent resin 140 turns to become a solid phase.

Meanwhile, the guide part 160 can increase an amount of light emitted toward the upper surface of the backlight unit if the guide part 160 is made of material capable of reflecting the light emitted from the light emitting diodes.

As erstwhile mentioned, unlike the prior art, there is an advantage in the present invention in that it does not use a lateral light emitting diode package to enable to dispense with a hot spot baffle plate named as a diverter to the backlight unit, and fabricating process of a display panel can be simplified and the thickness of the backlight unit can be thinned.

There is another advantage in that there is no problem of worrying an erroneous arrangement of a hot spot baffle plate, and an amount of light radiated toward the upper surface of the light emitting diodes can be increased to thereby enable to improve the picture quality of the display.

Figure 11:
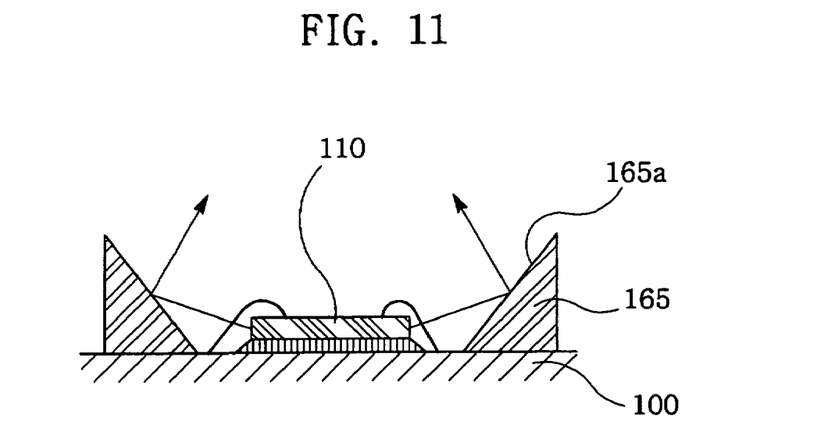
FIG. 11 is a schematic view illustrating another function of a ring-shaped guide part for guiding a liquefied transparent resin according to the present invention.

FIG. 11 is a schematic view illustrating another function of a ring-shaped guide part for guiding a liquefied transparent resin according to the present invention.

If an inner wall 165*a* of a ring-shaped guide part 165 formed on the upper surface of the substrate 100 is inclined, light emitted from the light emitting diodes 110 existing at an inner region of the guide part 165 is reflected from the inclined inner wall 165*a* of the guide part 165 to increase the amount of light radiated toward the upper surface of the light emitting diodes 110.

At this time, one light emitting diode 110 may be packaged on the inner side of the ring-shaped guide part 165.

Figure 12:
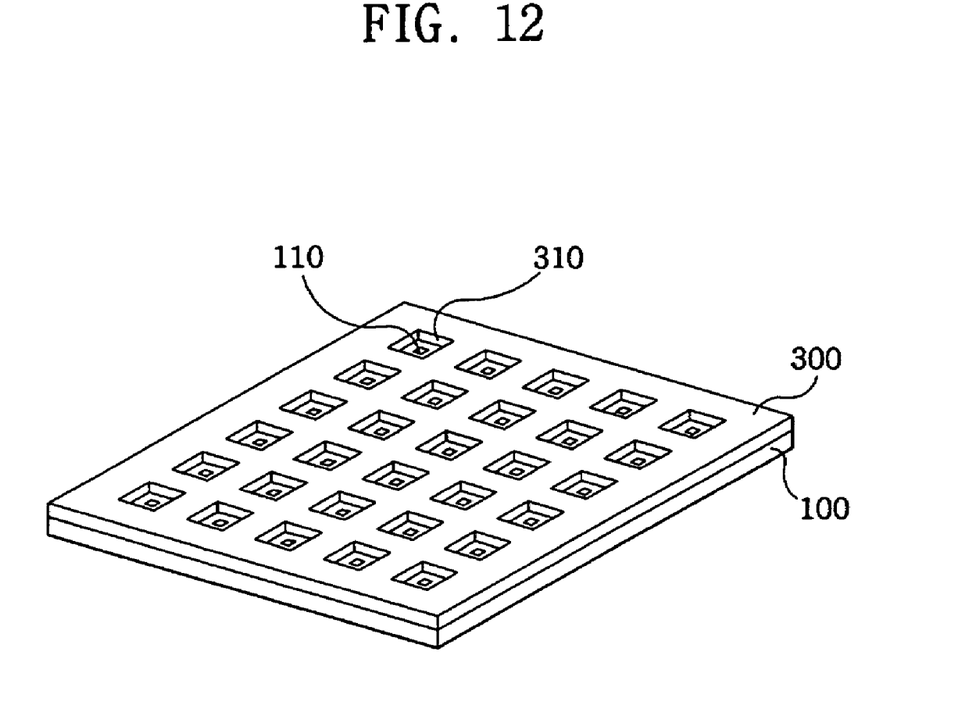
FIG. 12 is a schematic perspective view illustrating a state where a guide substrate formed with a plurality of through holes is bonded to an upper surface of a substrate according to the present invention.

Now, referring to FIG. 12, if a plurality of light emitting diodes 110 are packaged on an upper surface of the substrate 100, each spaced a predetermined distance apart, a guide substrate 300 formed with a plurality of through holes 310 each spaced a predetermined distance apart is prepared, and a process of bonding the guide substrate 300 formed with the plurality of through holes 310 to the substrate 100 by correspondingly positioning each of the plurality of the light emitting diodes 110 to each inner side of the through holes of the guide substrate 300, a structure where the light emitted from the plurality of light emitting diodes is radiated only toward the upper surface can be embodied.

Preferably, inner walls of the through holes 310 at guide substrate 300 are inclined, and the through holes 310 are coated with a transparent resin layer wrapping the light emitting diode 110.

Meanwhile, the plurality of light emitting diodes 110 are connected to electrode lines wired to the substrate 100, enabling to receive the electric power from outside. In other words, a structure for emitting light upwards of the light emitting diodes includes a substrate 100, a plurality of light emitting diodes 110 packaged on an upper surface of the substrate 100, each spaced a predetermined distance apart, and a plurality of through holes 310 correspondingly positioned against each light emitting diode, and the guide substrate 300 is bonded to the upper surface of the substrate 100. If the guide substrate 300 is positioned with the afore-mentioned optical transmission means, a backlight unit can be embodied.

Therefore, if the backlight unit is further comprised of the guide substrate 300, an upper surface of the guide substrate 300 is flattened to make it easier for the optical transmission means to be positioned thereon, thereby enabling to perform an easy process of fabricating the backlight unit.

Figure 13A:
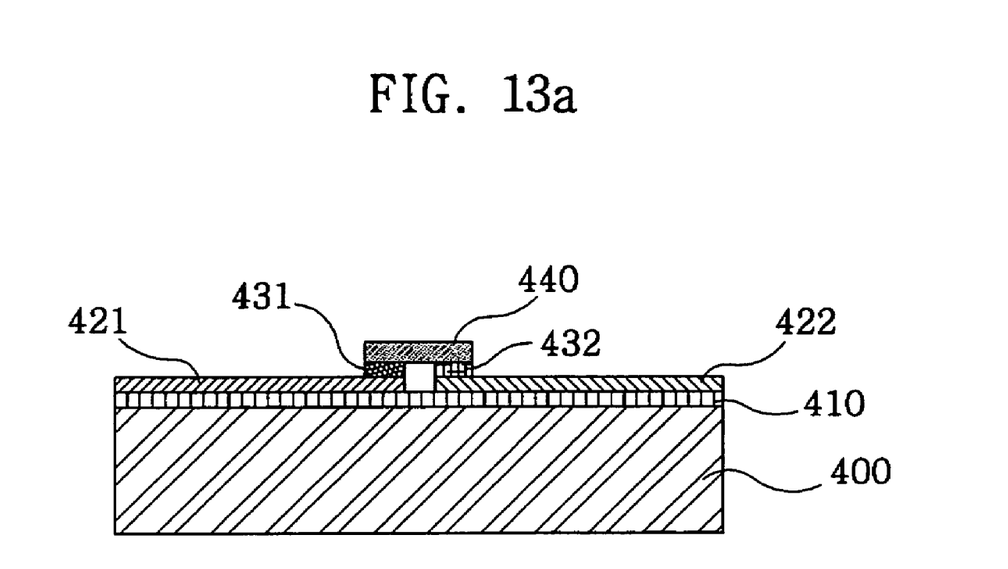
FIGS. 13a to 13c are cross-sectional views illustrating a state where a light emitting diode is packaged to an upper surface of a conductive substrate according to the present invention.

Now, referring to FIG. 13*a*, a conductive substrate 400 is formed thereon with an insulation layer 410, and the insulation layer 410 is formed thereon with electrode lines 421 and 422, where the electrode lines 421 and 422 are flip-chip bonded to the light emitting diodes in the form of conductive bumps 431 and 432.

Figure 13B:
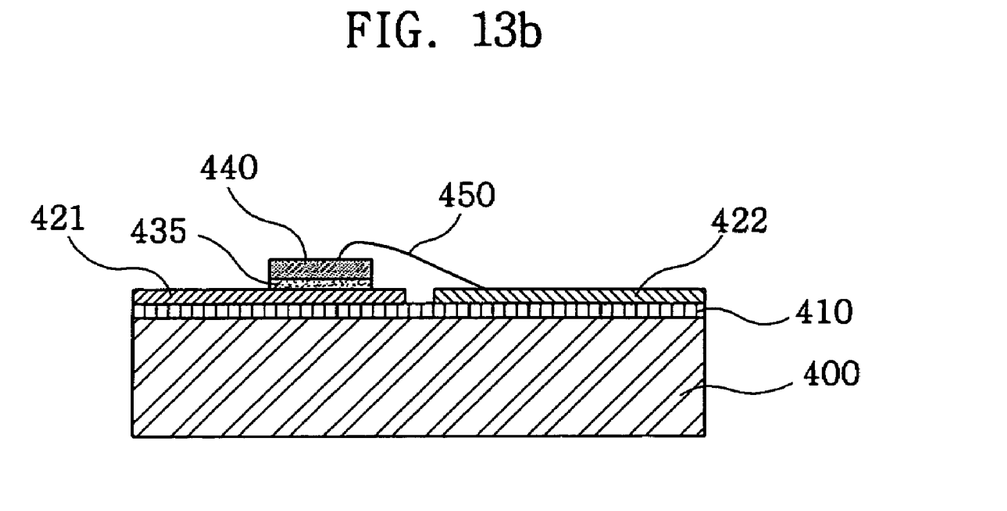

Referring to FIG. 13*b*, a light emitting diode 440 is joined to one electrode line 421 using a conductive adhesive 435, and the light emitting diode 440 is wire-bonded to another electrode line 422. At this time, the light emitting diode 440 is of a vertical type where upper and lower surfaces thereof are formed with electrode terminals.

Figure 13C:
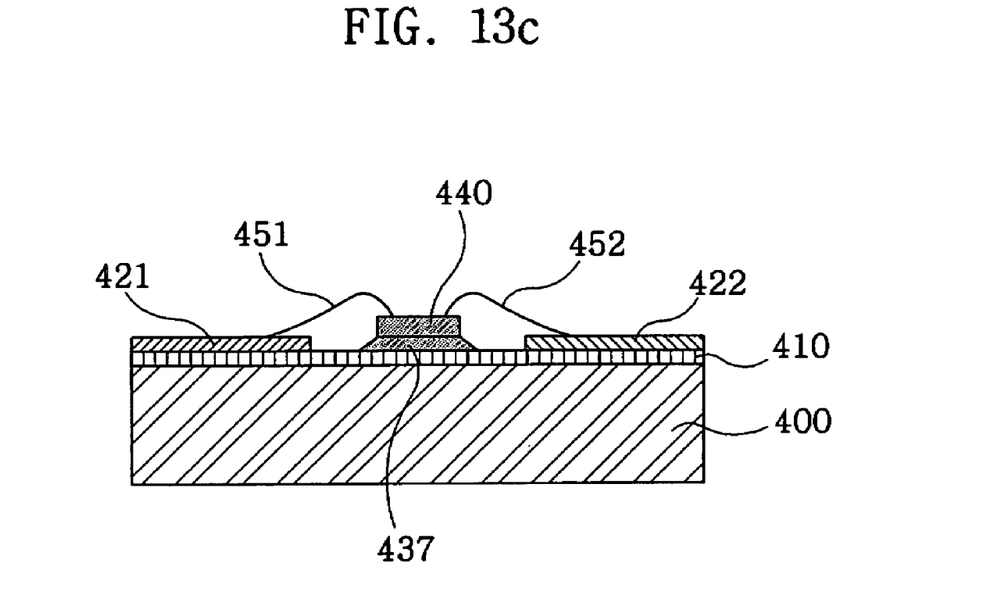

Now, referring to FIG. 13c, the light emitting diode 440 is joined to the insulation layer using insulation adhesive 437, and the light emitting diode 440 is wire-bonded to two electrode lines 421 and 422. At this time, the light emitting diode 440 is of a horizontal type where an electrode terminal is formed only on the upper surface.

Figure 14A:
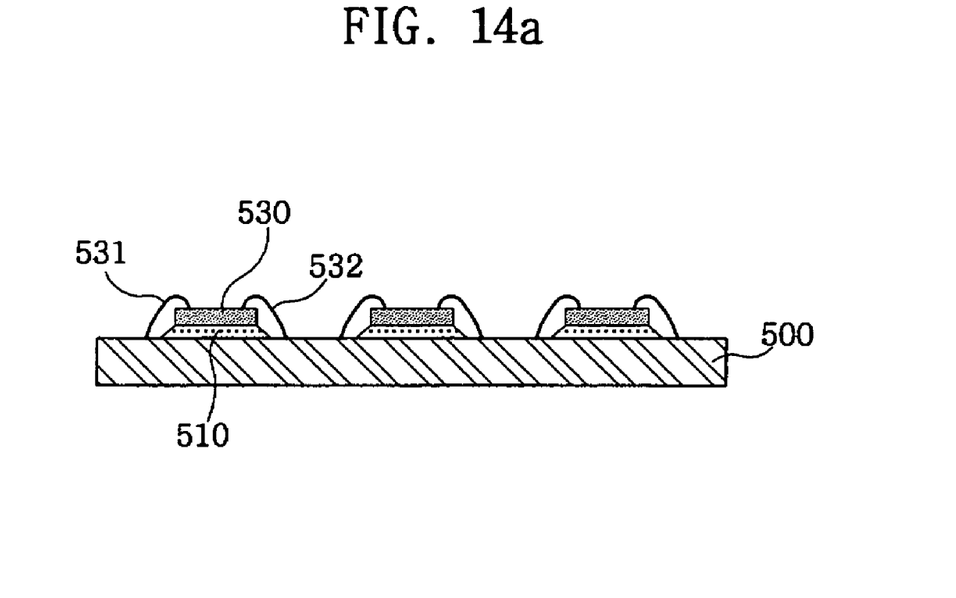
FIGS. 14a to 14d are cross-sectional views illustrating a fabricating process of a backlight unit having a light emitting diode according to the present invention.
Figure 14B:
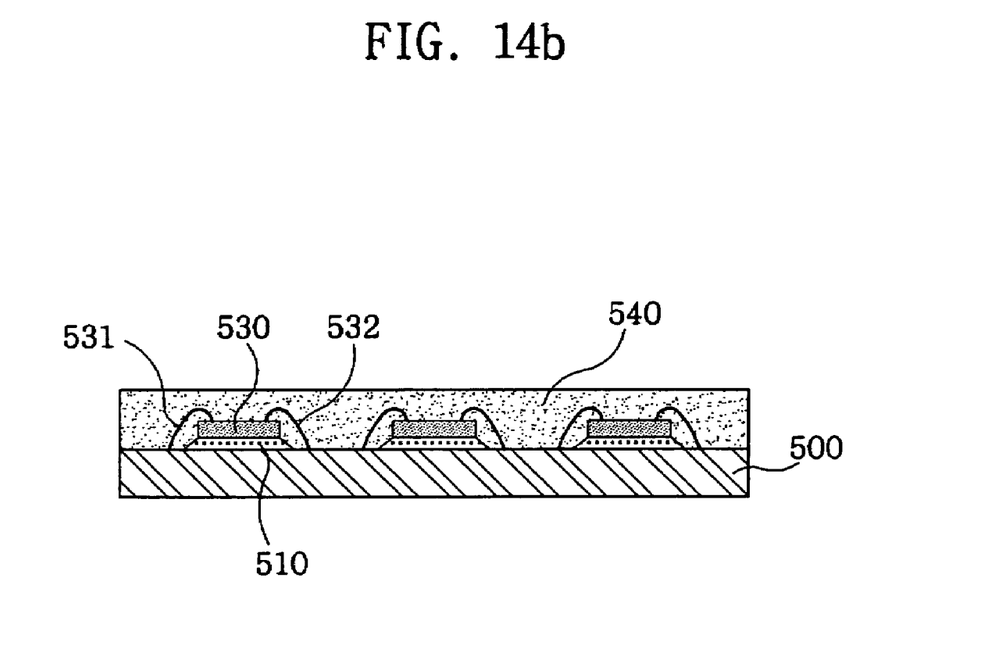

Referring to FIG. 14a, a substrate 500 formed thereon with conductive lines is bonded thereon to a plurality of light emitting diodes 520 each spaced a predetermined distance, and the plurality of light emitting diodes 520 are electrically connected to conductive lines of the substrate 500. As shown in FIG. 14b, the plurality of light emitting diodes 520 on the substrate 500 are wrapped by transparent resin film 540. Successively, optical transmission means 550 is positioned as depicted in FIG. 14c, the optical transmission means including first means for preventing light emitted from the light emitting diode from being totally reflected by allowing an incident angle of the light to be less than a threshold angle, and second means for diffusing and emitting the light.

Figure 14C:
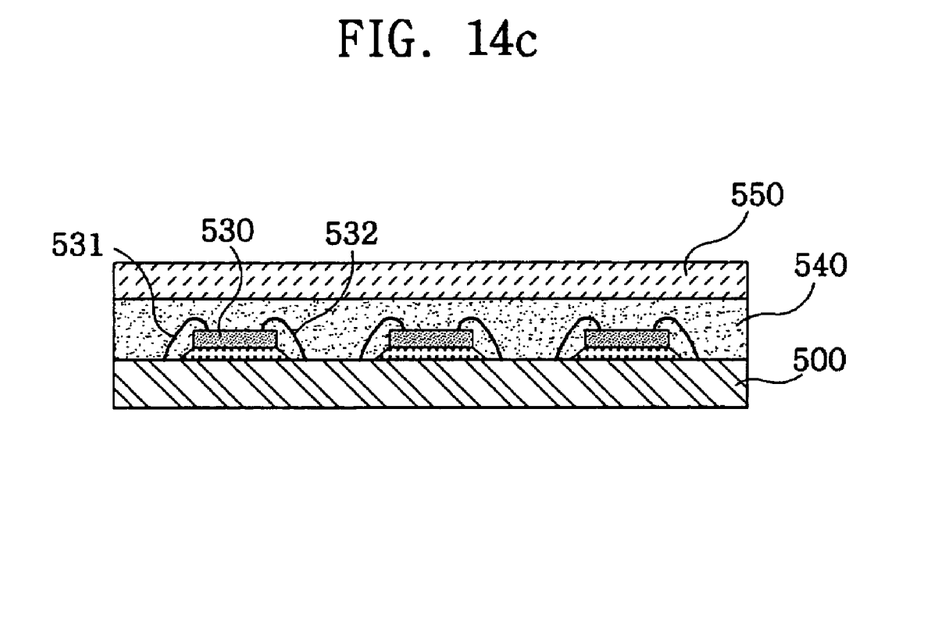
Figure 14D:
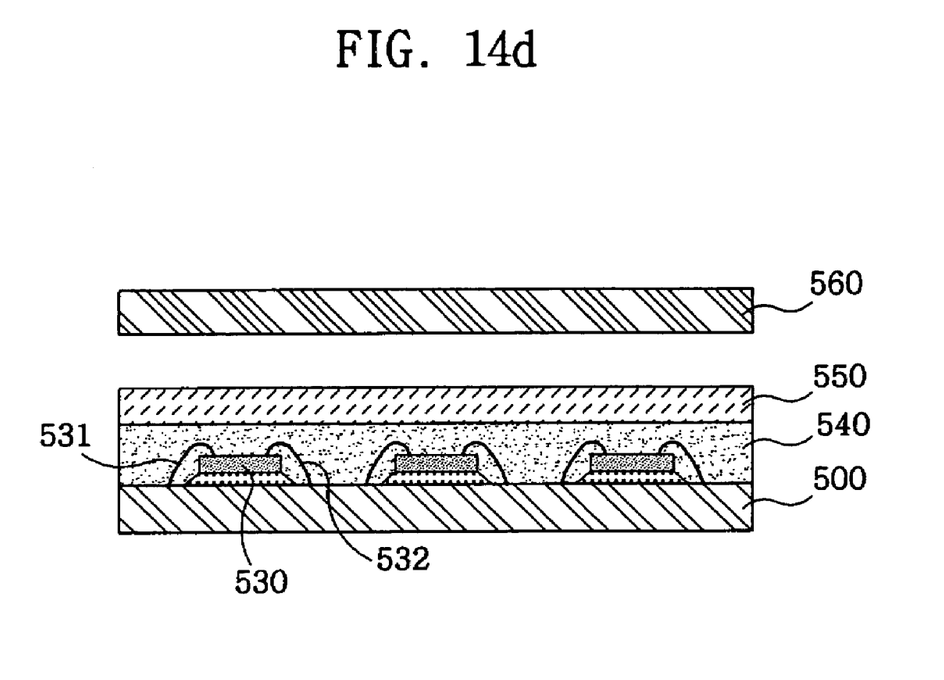

Once the processes from FIG. 14a to FIG. 14c are performed, the backlight unit according to the present invention can be fabricated. Furthermore, the afore-mentioned features of the substrate, the guide part and the guide substrate are added to the fabricating processes. Still furthermore, once the backlight unit is completed, it is assembled with a liquid crystal display (LCD) panel as shown in FIG. 14d.

As apparent from the foregoing, there is an advantage in the backlight unit having light emitting diodes and a method for manufacturing the same according to the present invention thus described in that a hot spot is not generated without recourse to use of a conventional lateral light emitting diode package to enable to improve a picture quality, and the method dispenses with an assembling process of placing a hot spot baffle plate to enable to simplify a manufacturing process of a backlight unit, and to reduce a thickness of the backlight unit.

While the above description has pointed out novel features of the invention as applied to various embodiments, the skilled person will understand that various omissions, substitution, and changes in the form and details of the device or process illustrated may be made without departing from the scope of the invention. Therefore, the scope of the invention is defined by the appended claims rather than by the foregoing description. All variations coming within the meaning and range of equivalency of the claims are embraced within their scope.

What is claimed is:

1. A backlight unit having light emitting diodes comprising:
   a substrate disposed thereon with first conductive lines;
   a plurality of light emitting diodes each bonded to an upper surface of the substrate and spaced a predetermined distance apart from the substrate, and electrically connected to the first conductive lines of the substrate;
   a transparent resin encompassing the plurality of light emitting diodes and formed on the upper surface of the substrate; and
   optical transmission means disposed on an upper surface of the transparent resin, the means including first means for preventing light emitted from the light emitting diodes from being totally reflected by allowing an incident angle of the light to be less than a threshold angle, and second means for diffusing and emitting the light,
   wherein the substrate is further formed thereon with a plurality of first grooves, and each floor surface of the plurality of first grooves is bonded to the light emitting diode, and
   wherein each interior of the plurality of grooves is bonded to a sub-mount substrate formed thereon with a second groove, a floor surface of the second groove formed with a conductive pattern, and formed thereon with a second conductive line electrically connected to the conductive pattern, and wherein each light emitting diode is flip-chip bonded to the conductive pattern existing on the floor surface of the second groove of the sub-mount substrate, and the second conductive line of the sub-mount substrate and the corresponding first conductive line of the substrate are wire-bonded.

2. The unit as defined in claim 1, wherein the substrate is a metal substrate, and wherein the metal substrate is further formed thereon with an insulation layer, and the corresponding first conductive line of the substrate is formed on an upper surface of the insulation layer.

3. The unit as defined in claim 1, wherein a margin of the substrate further comprises a ring-shaped guide part, and wherein the transparent resin is transformed in such a manner that a liquid transparent resin is coated on an inside of the guide part and the coated transparent resin is hardened to become a solid transparent resin.

4. The unit as defined in claim 3, wherein an inner wall of the ring-shaped guide part is inclined.

5. The unit as defined in claim 1, further comprising:
   a guide substrate formed therein with a plurality of through holes each correspondingly positioned to the plurality of light emitting diodes, and bonded to an upper surface of the substrate,
   wherein the optical transmission means is disposed on an upper surface of the guide substrate, and
   wherein the first means of the optical transmission means is a micro lens array sheet including a plurality of lenses, and the second means is a light guide plate in direct contact with the plurality of lenses of the micro lens array sheet.

6. The unit as defined in claim 5, wherein an inner wall of each through hole at the guide substrate is inclined.

7. The unit as defined in claim 5, wherein the substrate is a metal substrate, and wherein the metal substrate is further formed thereon with an insulation layer, and a conductive line of the substrate is formed on an upper surface of the insulation layer.

8. The unit as defined in claim 5, wherein the through holes of the guide substrate further comprise a transparent resin layer wrapping and coated on the light emitting diode.

9. The unit as defined in claim 5, wherein the the light guide plate is in direct contact with an opposite side of the micro lens array sheet including the plurality of lenses.

10. The unit as defined in claim 5, wherein the optical transmission means is configured in such a manner that the micro lens array sheet is positioned on the guide substrate with the plurality of lenses facing the guide substrate, and the light guide plate is positioned on the micro lens array sheet.

11. The unit as defined in claim 5, wherein the optical transmission means is configured in such a manner that the light guide plate is positioned on the guide substrate, and the micro lens array sheet is positioned on the light guide plate with the plurality of lenses facing the light guide plate.

* * * * *